(12) United States Patent
Herrmann

(10) Patent No.: US 10,957,813 B2
(45) Date of Patent: Mar. 23, 2021

(54) METHOD FOR PRODUCING OPTOELECTRONIC SEMICONDUCTOR COMPONENTS AND OPTOELECTRONIC MODULES, AND OPTOELECTRONIC SEMICONDUCTOR COMPONENT AND OPTOELECTRONIC MODULE

(71) Applicant: OSRAM Opto Semiconductors GmbH, Regensburg (DE)

(72) Inventor: Siegfried Herrmann, Neukirchen (DE)

(73) Assignee: OSRAM OLED GMBH, Regensburg (DE)

( * ) Notice: Subject to any disclaimer, the term of this patent is extended or adjusted under 35 U.S.C. 154(b) by 60 days.

(21) Appl. No.: 16/309,995

(22) PCT Filed: May 24, 2017

(86) PCT No.: PCT/EP2017/062635
§ 371 (c)(1),
(2) Date: Dec. 14, 2018

(87) PCT Pub. No.: WO2017/215895
PCT Pub. Date: Dec. 21, 2017

(65) Prior Publication Data
US 2019/0172972 A1 Jun. 6, 2019

(30) Foreign Application Priority Data

Jun. 16, 2016 (DE) .......................... 102016111059.0

(51) Int. Cl.
*H01L 21/00* (2006.01)
*H01L 33/00* (2010.01)
(Continued)

(52) U.S. Cl.
CPC .......... *H01L 33/0095* (2013.01); *H01L 33/50* (2013.01); *H01L 33/52* (2013.01);
(Continued)

(58) Field of Classification Search
CPC ..... H01L 21/56; H01L 21/563; H01L 21/565; H01L 21/566; H01L 33/0095; H01L 33/50; H01L 33/52; H01L 33/54
(Continued)

(56) References Cited

U.S. PATENT DOCUMENTS 9,287,479 B2    3/2016  Kim
9,490,397 B2   11/2016  Preuss et al.
(Continued)

FOREIGN PATENT DOCUMENTS

DE    102009018603 A1   2/2010
DE    102012109112 A1   4/2014
(Continued)

*Primary Examiner* — Brook Kebede
(74) *Attorney, Agent, or Firm* — Slater Matsil, LLP

(57) ABSTRACT

In an embodiment, a method for producing a plurality of optoelectronic semiconductor components is disclosed, wherein the method includes inserting a plurality of optoelectronic semiconductor chips with a suitable orientation into a linear feeding device, conveying the optoelectronic semiconductor chips to an injection device having an outlet opening, encapsulating the optoelectronic semiconductor chips with at least one cladding layer in the injection device and pressing the encapsulated optoelectronic semiconductor chips out of the outlet opening, wherein a compound of optoelectronic semiconductor chips is formed in which the optoelectronic semiconductor chips are connected to one another by the at least one cladding layer and separating the compound into a plurality of optoelectronic semiconductor components each component having an optoelectronic semiconductor chip which is at least partially encapsulated by the at least one cladding layer.

11 Claims, 9 Drawing Sheets

(51) Int. Cl.
*H01L 33/54* (2010.01)
*H01L 33/50* (2010.01)
*H01L 33/52* (2010.01)

(52) U.S. Cl.
CPC ........ H01L 33/54 (2013.01); *H01L 2933/005* (2013.01); *H01L 2933/0041* (2013.01)

(58) Field of Classification Search
USPC .................. 438/28, 112, 113, 124, 126, 127
See application file for complete search history.

(56) References Cited

U.S. PATENT DOCUMENTS

| | | | |
|---|---|---|---|
| 2008/0009576 A1* | 1/2008 | Alexander | C08L 55/02 524/407 |
| 2008/0079351 A1 | 4/2008 | Tokunaga et al. | |
| 2010/0291313 A1 | 11/2010 | Ling | |
| 2015/0188000 A1 | 7/2015 | Huang et al. | |
| 2016/0240396 A1* | 8/2016 | Cheon | B29C 33/10 |
| 2017/0148966 A1 | 5/2017 | Schwarz et al. | |
| 2018/0102466 A1 | 4/2018 | Herrmann | |

FOREIGN PATENT DOCUMENTS

| | | |
|---|---|---|
| DE | 102012113003 A | 4/2014 |
| DE | 102014113844 A1 | 3/2016 |
| DE | 102015104886 A1 | 10/2016 |
| WO | 2008031580 A1 | 3/2008 |
| WO | 2015091385 A | 6/2015 |
| WO | 2015189216 A1 | 12/2015 |

* cited by examiner

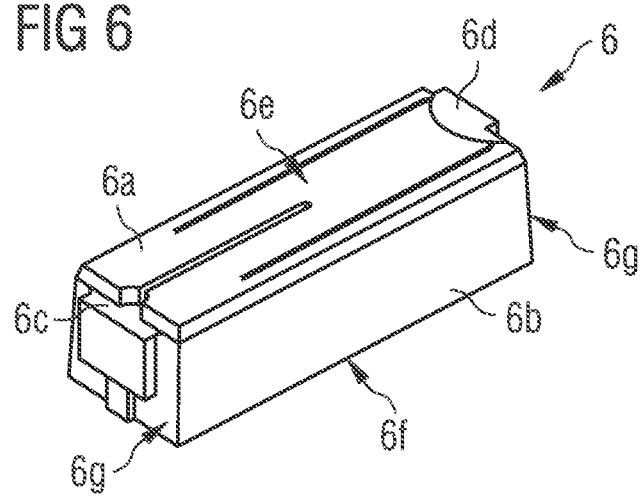
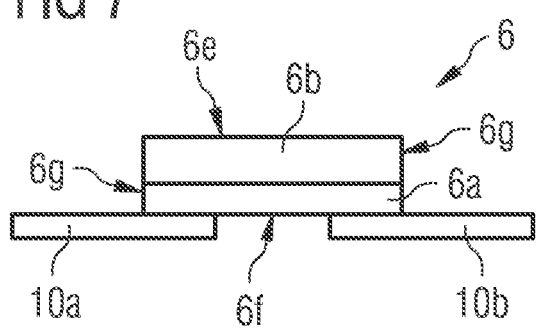

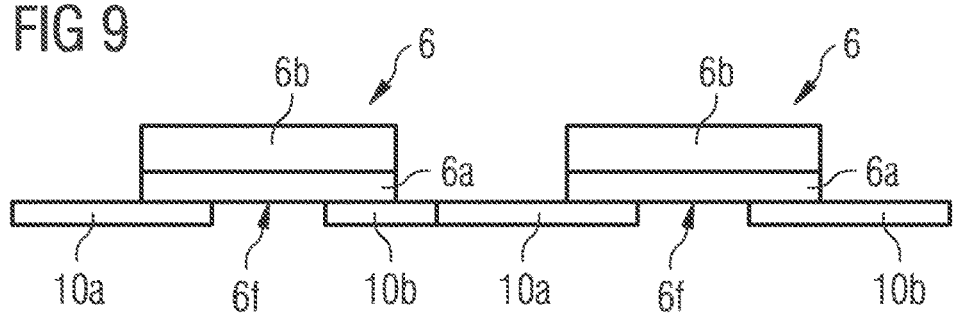
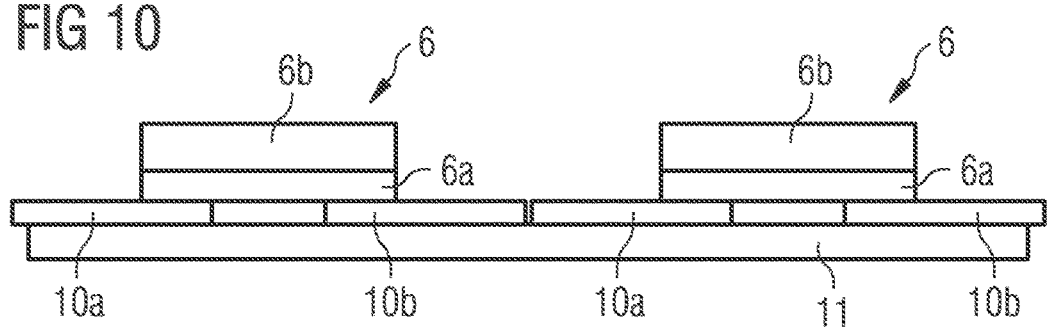
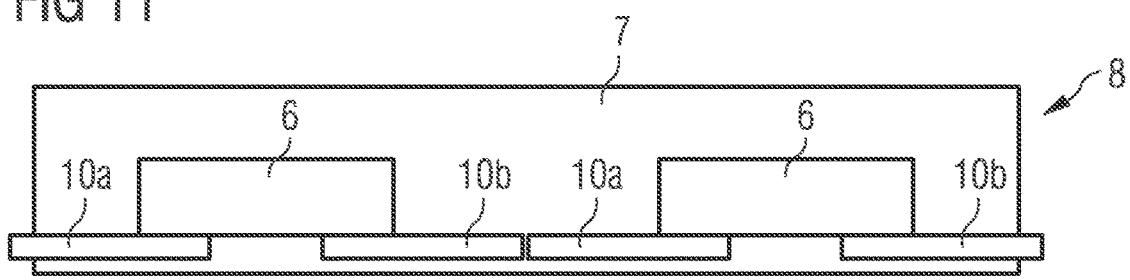
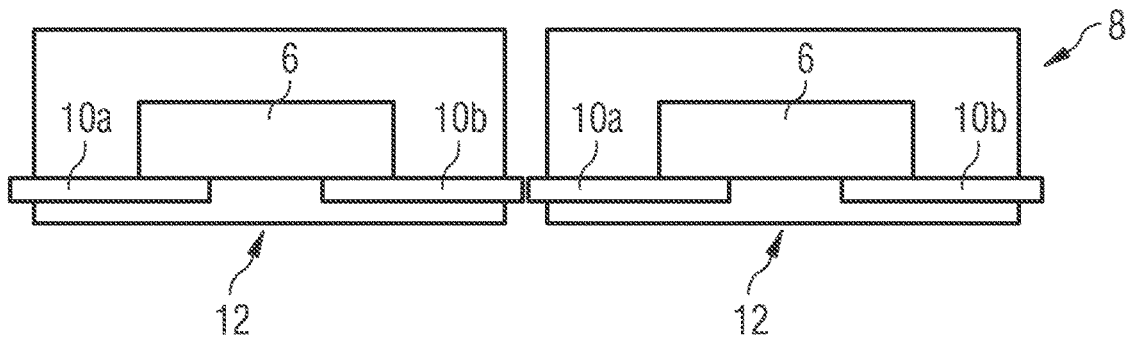

METHOD FOR PRODUCING OPTOELECTRONIC SEMICONDUCTOR COMPONENTS AND OPTOELECTRONIC MODULES, AND OPTOELECTRONIC SEMICONDUCTOR COMPONENT AND OPTOELECTRONIC MODULE

This patent application is a national phase filing under section 371 of PCT/EP2017/062635, filed May 24, 2017, which claims the priority of German patent application 102016111059.0, filed Jun. 16, 2016, each of which is incorporated herein by reference in its entirety.

TECHNICAL FIELD

A method for manufacturing optoelectronic semiconductor components and optoelectronic modules as well as an optoelectronic semiconductor component and optoelectronic module are specified.

BACKGROUND

The cost-effective production of optoelectronic semiconductor components or optoelectronic modules requires manufacturing methods that are suitable for mass production of optoelectronic semiconductor components or optoelectronic modules.

SUMMARY OF THE INVENTION

Embodiments provide a process suitable for cost-effective production of optoelectronic semiconductor components or optoelectronic modules.

Further embodiments provide a low-cost optoelectronic semiconductor component and a low-cost optoelectronic module.

According to at least one embodiment, a device with different functional areas is used to carry out the method described here. Preferably the device is an extruder.

A first functional area of the device may be formed by an inlet device. For example, the inlet device may be suitable for sorting optoelectronic semiconductor chips according to their spatial orientation. For example, the inlet device can be a so-called bowl feeder, where the optoelectronic semiconductor chips are introduced unsorted as bulk material and then sorted, whereby only semiconductor chips with a suitable orientation are forwarded. Alternatively, the optoelectronic semiconductor chips can already be provided in the inlet device with the appropriate orientation, for example, by a so-called pick-and-place process.

Preferably the device comprises a second functional area, which is formed in particular by a feeding device. The feeding device, for example, is a linear guide element with a cavity through which the optoelectronic semiconductor chips are fed. In particular, the feeding device has an inlet opening through which the optoelectronic semiconductor chips are introduced into the feeding device.

Furthermore, the device preferably comprises a third functional area formed by an injection device with an outlet opening. The injection device can have several injection regions. The injection device or the injection regions in particular are nozzles. In the injection device, material is provided for the encapsulation of the optoelectronic semiconductor chips. If the injection device has several injection regions, different materials are preferably fed from these.

The injection device should preferably be connected directly to the feeding device. The feeding device can also be connected directly to the inlet device.

In a preferred design, the outlet opening has an oval, in particular circular or elliptical, cross-section. Furthermore, the outlet opening may have a polygonal, in particular rectangular, or star-shaped cross-section.

The following describes a method for manufacturing several optoelectronic semiconductor components and/or at least one optoelectronic module. In particular, the procedure is carried out in the device described above.

In accordance with at least one embodiment of a process for producing a plurality of optoelectronic semiconductor components and/or at least one optoelectronic module, this has the following steps: providing a plurality of optoelectronic semiconductor chips; insertion of optoelectronic semiconductor chips with suitable orientation into a linear feeding device; conveying the optoelectronic semiconductor chips to an injection device having an outlet port; encapsulating the optoelectronic semiconductor chips with at least one cladding layer in the injection device and pressing the encapsulated optoelectronic semiconductor chips out of the outlet opening, wherein a compound of optoelectronic semiconductor chips is formed in which the optoelectronic semiconductor chips are interconnected by the at least one cladding layer; separating the compound into a plurality of optoelectronic semiconductor components which each have an optoelectronic semiconductor chip which is at least partially encapsulated by the at least one cladding layer, and/or separating the compound into at least one optoelectronic module having a plurality of optoelectronic semiconductor chips which are at least partially encapsulated by the at least one cladding layer and are connected to one another by the latter.

In particular, the optoelectronic semiconductor chips have a suitable orientation when at least one surface normal of a surface of the optoelectronic semiconductor chips is aligned parallel to a main extension direction of the linear feeding device.

If the process is preferred, the optoelectronic semiconductor chips are inserted into the feeding device one after the other. This means that two optoelectronic semiconductor chips do not pass through the inlet opening of the feeding device at the same time.

In an advantageous embodiment, additionally to the optoelectronic semiconductor chips further elements, that are to become part of the optoelectronic semiconductor component or module, can be introduced into the feeding device and can be at least partially encapsulated. Possible applications include optical elements or metal strands that serve as connection means between adjacent optoelectronic semiconductor chips. For example, the further elements, especially metal strands, can be arranged between successive cladding layers.

According to at least embodiment, the optoelectronic semiconductor chips are loosely inserted into the feeding device. This means that there is no mechanical connection between the optoelectronic semiconductor chips. Alternatively, the optoelectronic semiconductor chips can already be introduced into the feeding device as a compound, wherein the optoelectronic semiconductor chips are connected to one another by a mount and/or a connection means. In particular this enables the realization of optoelectronic modules. For example, a printed circuit board, in particular a flexible printed circuit board, can be used as a mount. As connection means, for example, adhesion promoters, metal compounds, for example, soldered joints, or bonding wires may be considered. Preferably, the optoelectronic semiconductor chips are electrically interconnected. For example, the optoelectronic semiconductor chips form a series circuit in a compound.

In the feeding device, optoelectronic semiconductor chips may be conveyed by means of a piston which pushes the optoelectronic semiconductor chips through the cavity of the feeding device. Alternatively, the feeding device may be inclined so that the optoelectronic semiconductor chips are conveyed by gravity. A conveying direction of the optoelectronic semiconductor chips preferably runs from the inlet opening of the feeding device to the outlet opening of the injection device.

In the injection device, the optoelectronic semiconductor chips can at least partially be provided with a cladding layer. Preferably, a material used for the cladding layer is fed transversely to a transport direction of the optoelectronic semiconductor chips. "Transverse" means a direction which is not parallel to the direction of transport but at an angle greater than 0° and less than or equal to 90°.

It is advantageous that the process described here does not make high demands on the quality of the material used for the cladding layer. For example, brittle or soft materials can also be processed. The material is preferably injected liquid and under pressure into the injection device. Depending on the material, pressures from 10 bar to 1500 bar and temperatures from 60° C. to 300° C. are used. Alternatively, it is possible to provide the material for creating the cladding layer as a film.

Materials for at least one cladding layer are preferably plastic materials, in particular thermoplastics. Suitable plastics are, for example, hard polyethylene (HDPE), soft polyethylene (LDPE), medium soft polyethylene (MDPE), linear soft polyethylene (LLDPE), thermoplastic elastomers (TPE), cross-linked thermoplastic elastomers (TPV), polypropylene (PP), polystyrene (PS), polyamides (PA), polymethyl methacrylate (PMMA), polycarbonate (PC), thermoplastic polyurethane (TPU), Polyurethane (PUR), polyethylene terephthalate (PET), soft polyvinyl chloride (W-PVC), rigid polyvinyl chloride (H-PVC), ethylene vinyl alcohol copolymer (EVOH), ethylene vinyl acetate (EVA), ABS, polyoxymethylene (POM) and polyether ether ketone (PEEK), hot melt adhesives, adhesion promoters, glass fiber reinforced materials, chalk-filled polyolefins, fluoropolymers.

Other suitable materials are epoxy resins or silicones or hybrid materials containing epoxy and silicone.

In a preferred embodiment, the base material for the cladding layer is a radiation lucent material that is transparent to radiation with wavelengths in the visible range. A cladding layer containing a radiation lucent base material is particularly suitable in an optoelectronic semiconductor component as an optical element and/or encapsulation and/or conversion element.

According to at least one embodiment, the at least one cladding layer may contain material additives embedded in the base material. Possible material additives are conversion materials or reflective particles. For example, the conversion materials may contain chlorosilicates, orthosilicates, sulfides, thiometals, vanadates, aluminates, oxides, halophosphates, nitrides, sions, sialons and garnets of the rare earth elements such as YAG:Ce and alkaline earth elements. The reflecting particles contain in particular $TiO_2$, $SiO_2$ or Al. Besides Nanocrystals also so-called quantum dots may be used as conversion agents.

According to at least one embodiment of the process, the injection device has several injection regions from which different materials are fed. Different cladding layers may be produced from the different materials. In particular, the injection regions are arranged one after the other in the conveying direction of the optoelectronic semiconductor chips, different cladding layers being produced by means of the injection regions, which cladding layers are arranged one after the other in a direction extending transversely to the conveying direction starting from the optoelectronic semiconductor chip. For example, the various cladding layers can be made of materials with different refractive indices, so that the finished optoelectronic semiconductor component is embedded in an encapsulation with a changing refractive index.

According to at least one embodiment, each individual optoelectronic semiconductor chip is continuously encapsulated and pressed out of the outlet opening of the injection device. The individual optoelectronic semiconductor chip is therefore not first encapsulated and then pressed out, but gradually encapsulated and pressed out.

According to at least one embodiment, the shape of the optoelectronic semiconductor component or optoelectronic module is determined by the shape of the outlet opening. Because, when the encapsulated optoelectronic semiconductor chips are pressed out, the shape of the outlet opening is imprinted on the cladding layer. In particular, the shape of the outlet opening determines the shape of the optoelectronic semiconductor components or the optoelectronic module such that a cross-section of the outlet opening corresponds to a cross-section of the optoelectronic semiconductor components or the optoelectronic module. A correspondence results thereby regarding form and size of the cross section. The process described here is an extrusion process because it is pressed out of the shaping outlet opening.

According to at least one embodiment, the outlet opening has an oval cross-section, which creates a cylindrical bond when pressed out. In addition, the outlet opening may have a polygonal cross section, resulting in a prismatic compound when pressed out.

Preferably, the pressing out takes place in a linear movement, i.e., along the conveying direction, so that the compound extends linearly. Alternatively, it is also possible to deviate from the direction of transport when pressing out. This can be done by moving the injection device or a base on which the compound is applied during the pressing process. This allows the bond to be formed with any geometric shape. For example, it is possible to generate illuminated letters in this way.

After pressing out, the compound can be reworked. For example, the cladding layer can be provided with a surface structure. This can be done, for example, by rolling, since the cladding layer can still be deformed shortly after being pressed out.

In addition, the compound can be arranged on or in a carrier. In particular, a carrier with a U-shaped cross-section is suitable. Such a carrier behaves like a guide rail into which the compound can be easily inserted. The compound is preferably inserted as long as the cladding layer is still deformable, so that the compound is precisely fitted in the carrier after cooling.

Successively after the rework, the compound is preferably first cured. Then the compound can be separated into several optoelectronic semiconductor components or optoelectronic modules. Separation may be effected by means of a separating device, in particular a punching tool. Finally, measurement and testing processes can be carried out.

Using the method described here, it is possible to produce a quantity of about 60,000 optoelectronic semiconductor components per hour. The process thus enables the mass production of optoelectronic semiconductor components and modules.

In the following, different designs of an optoelectronic semiconductor component and an optoelectronic module are described, which in particular are manufactured according to a process described above. This means that all features revealed for the process are also revealed for the optoelectronic semiconductor component and optoelectronic module and vice versa. Furthermore, all features revealed for the optoelectronic semiconductor component are also revealed for the optoelectronic module and vice versa.

Preferably, the optoelectronic semiconductor component and optoelectronic module are intended for radiation generation.

According to at least one embodiment, the optoelectronic semiconductor component comprises an optoelectronic semiconductor chip and at least one cladding layer which encapsulates the optoelectronic semiconductor chip in such a way that the optoelectronic semiconductor chip is mostly covered on its surface by the cladding layer. The surface of the optoelectronic semiconductor chip preferably consists of a first main surface, a second main surface opposite the first main surface, and side surfaces which are arranged transversely, in particular perpendicularly, to the first and second main surfaces. In a preferred embodiment, in particular the first and/or second main surface are completely covered by the cladding layer. In addition or alternatively, at least one side surface can be completely covered by the cladding layer. When the optoelectronic semiconductor chip is encapsulated, it is arranged relative to the direction of transport, in particular in such a way that surface normale of the first and second main surfaces run transversely, in particular perpendicularly, to the direction of transport. Furthermore, at least one side surface in particular is arranged in such a way that its surface normal is parallel to the direction of transport. This may be the shorter or longer side of the optoelectronic semiconductor chip in the case of the side face whose surface normal is parallel to the direction of transport.

In all embodiments, the optoelectronic semiconductor chip may have a semiconductor layer sequence comprising a first semiconductor region, a second semiconductor region, and an active zone located between the first and second semiconductor regions, particularly suitable for radiation generation. Preferably, the first semiconductor region is a p-type region. Furthermore, the second semiconductor area is particularly an n-conducting area. Furthermore, the optoelectronic semiconductor chip may have first and second terminal contacts, the first terminal contact being electrically connected to the first semiconductor region and the second terminal contact being electrically connected to the second semiconductor region.

According to at least one embodiment, the terminal contacts and/or connection means of the optoelectronic semiconductor chip are at least partially free of the cladding layer. In other words, the terminal contacts and/or connection means are not completely covered by the cladding layer so that the optoelectronic semiconductor chip can be electrically connected to the terminal contacts and/or connection means. After encapsulation, the terminal contacts and/or connection means can be exposed by removing the cladding layer in areas of the terminal contacts and/or connection means.

Materials based on nitride compound semiconductors are preferred for the semiconductor layer sequence or the first and second semiconductor areas. "Based on nitride compound semiconductors" in the present context means that at least one layer of the semiconductor layer sequence comprises a nitride III/V compound semiconductor material, preferably $Al_nGa_mIn_{1-n-m}N$, wherein $0 \leq n \leq 1$, $0 \leq m \leq 1$ and $n+m \leq 1$. This material does not necessarily have to have a mathematically exact composition according to the above formula. Rather, it may contain one or more dopants and additional components that essentially do not alter the characteristic physical properties of the $Al_nGa_mIn_{1-n-m}N$ material. For simplicity's sake, however, the above formula contains only the essential components of the crystal lattice (Al, Ga, In, N), even if these may be partially replaced by small amounts of other substances.

According to at least one embodiment, the optoelectronic semiconductor chip is a flip chip, in particular a sapphire chip. A flip chip is characterized in particular by the fact that the terminal contacts are arranged on one side of the semiconductor layer sequence which faces away from a substrate on which the semiconductor layer sequence is arranged. Furthermore, the substrate is in particular the growth substrate, which is formed, for example, from sapphire.

Furthermore, the optoelectronic semiconductor chip can also be designed in such a way that the terminal contacts are arranged on opposite side surfaces of the optoelectronic semiconductor chip.

In a preferred embodiment, the optoelectronic semiconductor chip is comparatively long. The optoelectronic semiconductor chip has a shorter and a longer side, whereby the longer side in particular is 10 times longer than the shorter side.

The at least one cladding layer can fulfil the function of at least one of the following elements in the optoelectronic semiconductor component: optical element, conversion element, encapsulation and package.

According to at least one design, the optoelectronic semiconductor component comprises a first cladding layer having a first refractive index and a second cladding layer having a second refractive index different from the first refractive index, the first cladding layer being disposed between the optoelectronic semiconductor chip and the second cladding layer. In particular, the first refractive index is greater than the second refractive index. Advantageously, it is thus possible to reduce total reflections at the transition between the optically denser (optoelectronic semiconductor chip) and optically thinner medium (air) and thus improve the radiation outcoupling. The cladding layers thus fulfil the function of an optical element with a refractive index gradient. At the same time, the cladding layers form an encapsulation of the optoelectronic semiconductor chip.

According to at least one embodiment, the at least one cladding layer contains one or more conversion materials. For example, the cladding layer may have a base material in which at least one conversion material is distributed preferably in homogeneous manner. The at least one cladding layer in this design fulfils the function of a conversion element which is suitable for converting the radiation emitted by the optoelectronic semiconductor chip at least partially into radiation of a different wavelength.

According to at least one design, the optoelectronic semiconductor component has a polygonal cross-section.

Furthermore, the semiconductor component may have a star-shaped cross-section. Here, the cladding layer can have prism-shaped or semi-cylindrical structural elements that run parallel to a main extension direction of the optoelectronic semiconductor chip. The main direction of extension runs in particular perpendicular to the surface normal of the main surfaces. The at least one cladding layer of this embodiment fulfils the function of an optical element which improves the radiation outcoupling.

According to at least one embodiment, the optoelectronic semiconductor component comprises a carrier having an assembly region on which the optoelectronic semiconductor chip is arranged and two opposing side regions arranged transversely to the assembly region, a space between the support and the optoelectronic semiconductor chip being filled by the cladding layer. The optoelectronic semiconductor chip can be arranged at a distance from the mounting area, whereby an interspace between the mounting area and the optoelectronic semiconductor chip is in particular completely filled by the cladding layer. In particular, the carrier has a U-shaped cross-section. The carrier can be designed as a reflector. Preferably the carrier contains or consists of a metal.

Alternatively, the carrier can be cylindrical or prism-shaped, with the optoelectronic semiconductor chip located inside the carrier. In the event that the carrier contains or consists of a metal, a structuring of the carrier is advisable. In other words, the carrier has advantageous interruptions that allow the passage of radiation. The carrier can also be made of a radiation lucent material, such as glass.

The process described above can be used to produce optoelectronic modules that have at least two optoelectronic semiconductor chips.

According to at least one design form, the optoelectronic module comprises a plurality of optoelectronic semiconductor chips and at least one cladding layer which encapsulates the optoelectronic semiconductor chips in such a way that the surface of the optoelectronic semiconductor chips is mostly covered by the cladding layer, the optoelectronic semiconductor chips being interconnected by the at least one cladding layer. Furthermore, the optoelectronic semiconductor chips can be electrically interconnected. For example, the optoelectronic semiconductor chips form a series circuit in the compound. The optoelectronic semiconductor chips can be arranged on a common mount, such as a printed circuit board, for example, a flexible printed circuit board.

According to at least one embodiment, the optoelectronic module comprises a carrier having an assembly region on which the optoelectronic semiconductor chips are arranged and two opposing side regions arranged transversely to the assembly region, a space between the support and the optoelectronic semiconductor chips being filled by the cladding layer. The optoelectronic semiconductor chips can be arranged at a distance from the mounting area, whereby a space between the mounting area and the optoelectronic semiconductor chips is completely filled by the cladding layer.

Advantageously, the diameter of the semiconductor component or module can be varied by the thickness of the cladding layer or the number of cladding layers. The length of the semiconductor component or module can also be adjusted as required. With the described process, modules with a length of up to several meters can be produced.

BRIEF DESCRIPTION OF THE DRAWINGS

Further advantages, advantageous embodiments and further developments result from the embodiments described in the following in connection with FIGS. 1 to 21.

Shown In:

FIG. 6 shows a schematic perspective representation of an optoelectronic semiconductor chip according to a first exemplary embodiment;

FIG. 7 shows a schematic cross-sectional view of an optoelectronic semiconductor chip according to a second exemplary embodiment;

FIGS. 9 and 10 show schematic cross-sectional views of a compound of optoelectronic semiconductor chips according to a second and third exemplary embodiment;

FIG. 11 shows a schematic cross-sectional view of a compound of optoelectronic semiconductor chips after cladding according to an exemplary embodiment;

FIG. 12 shows a schematic cross-sectional view of a compound of optoelectronic semiconductor chips during separation according to an exemplary embodiment;

DETAILED DESCRIPTION OF ILLUSTRATIVE EMBODIMENTS

Figure 1:
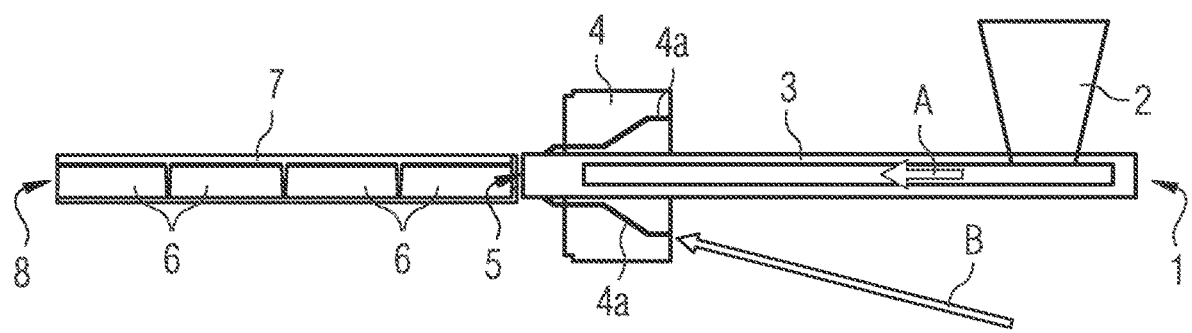
FIG. 1 shows a schematic cross-sectional view of a device and a method according to a first exemplary embodiment.

FIG. 1 shows a device 1 which is suitable for carrying out the method described herein. Preferably, device 1 is an extruder. The processes carried out by means of the device are, in particular, extrusion processes.

Device 1 has different functional areas. A first functional area of device 1 is formed by an inlet device 2. The inlet device 2 is a so-called bowl feeder, where optoelectronic semiconductor chips 6 are introduced unsorted as bulk material and where these are sorted, whereby only optoelectronic semiconductor chips 6 with a suitable orientation are conveyed further.

Furthermore, the device 1 comprises a second functional area formed by a feeding device 3. Feeding device 3 is a linear guide element with a cavity through which the optoelectronic semiconductor chips 6 are conveyed along a main extension direction A of Feeding device 3. The feeding device 3 has an inlet opening (not shown) through which the optoelectronic semiconductor chips 6 are inserted into the feeding device 3.

Furthermore, the device 1 comprises a third functional area formed by an injection device 4. The injection device 4 has channels 4a through which material B is fed into the injector 4. Furthermore, the injection device 4 has an outlet opening 5 from which the optoelectronic semiconductor chips 6 provided with a cladding layer 7 are pressed out.

Figure 2:
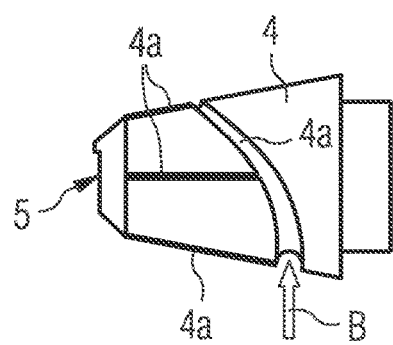
FIG. 2 shows a schematic perspective representation of an injection device according to a first exemplary embodiment.

FIG. 2 shows a preferred design of an injection device 4 in perspective view. The injection device 4 has channels 4a on its surface which lead into an interior (not shown) of the injection device 4. Via the channels 4a, material is injected into the interior to for encapsulation of the optoelectronic semiconductor chips. The injection device 4 is a nozzle.

In a preferred embodiment, the outlet opening 5 has an oval, in particular circular or elliptical, cross-section. In addition, the outlet opening 5 may have a polygonal, e.g., rectangular, or star-shaped cross-section.

The injection device 4 is connected directly to the feeding device 3. Furthermore, the feeding device 3 is directly connected to the inlet device 2.

In a process for producing a plurality of optoelectronic semiconductor components and/or at least one optoelectronic module which can be carried out by means of device 1 shown in FIG. 1, a plurality of optoelectronic semiconductor chips 6 are initially provided by the inlet device 2. The optoelectronic semiconductor chips 6 are introduced as bulk material into the inlet device 2 and are sorted there, so that only optoelectronic semiconductor chips 6 with a suitable orientation are transported further. The sorted optoelectronic semiconductor chips 6 are inserted with suitable orientation into the linear feeding device 3 and conveyed to the injection device 4. There, material for encapsulating the optoelectronic semiconductor chips 6 is introduced through the channels 4a into the injection device 4. Preferably the material is injected liquid and under pressure into the injection device 4. Depending on the material, pressures from 10 to 1500 bar and temperatures from 60 to 300° C. are used. Alternatively, it is possible to provide the material for the production of the cladding layer 7 as foil.

In the injection device 4, the optoelectronic semiconductor chips 6 are at least partially provided with a cladding layer 7. Preferably, a material used for cladding layer 7 is fed to optoelectronic semiconductor chips 6 transversely to a direction of conveyance A. The material used for the cladding layer 7 is fed to the optoelectronic semiconductor chips 6 in the direction of conveyance A. "Transverse" means a direction which is not parallel to the direction of transport A but at an angle greater than 0° and less than or equal to 90°.

The encapsulated optoelectronic semiconductor chips 6 are pressed out of the outlet opening 5 of the injection device 4, whereby a compound 8 of optoelectronic semiconductor chips 6 is formed, in which the optoelectronic semiconductor chips 6 are interconnected by at least one cladding layer 7.

The compound 8 can then be separated into a plurality of optoelectronic semiconductor components, each of which has an optoelectronic semiconductor chip 6 which is at least partially encapsulated by the at least one cladding layer 7 (see FIGS. 13 to 19). Furthermore, the compound 8 can be separated into at least one optoelectronic module with a plurality of optoelectronic semiconductor chips 6, which are at least partially encapsulated by the at least one cladding layer 7 and connected to one another by the latter (see FIGS. 20 and 21).

Figure 3A:
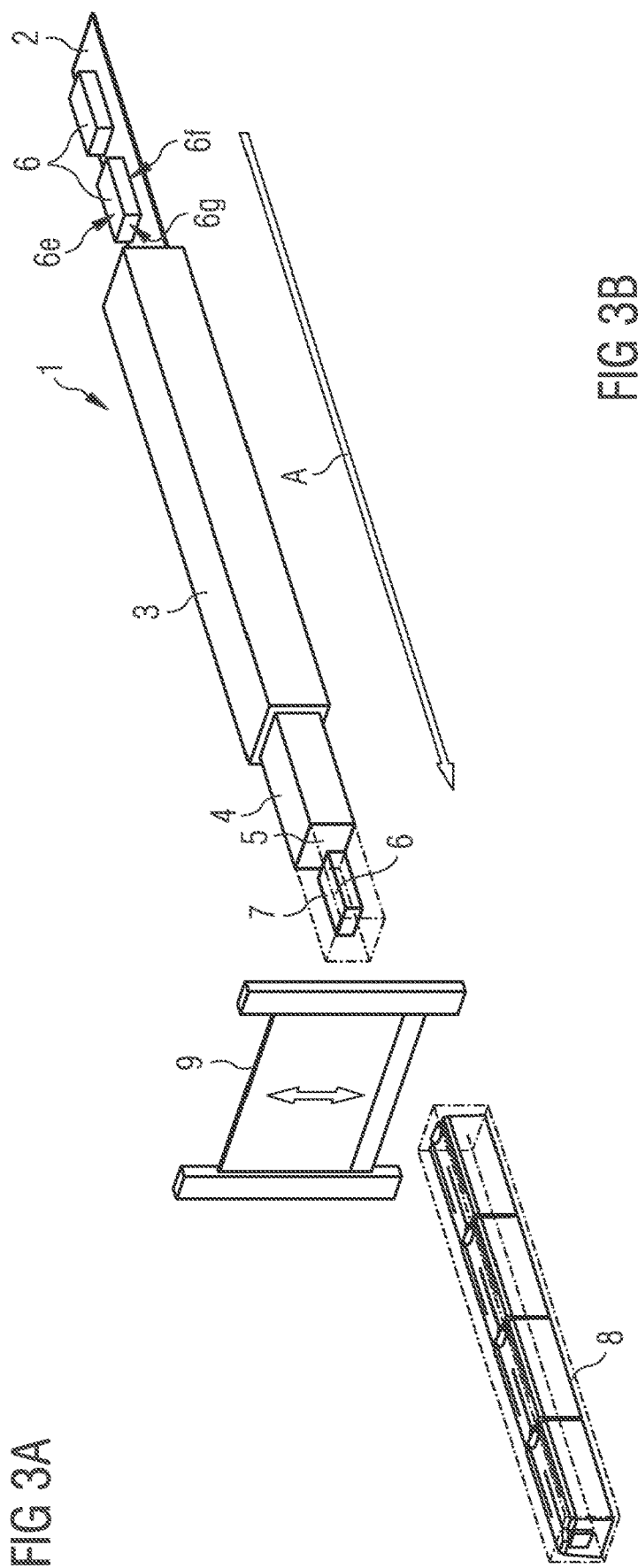
FIGS. 3A and 3B show schematic perspective representations of a device and a procedure according to a second and third exemplary embodiment.
Figure 3B:
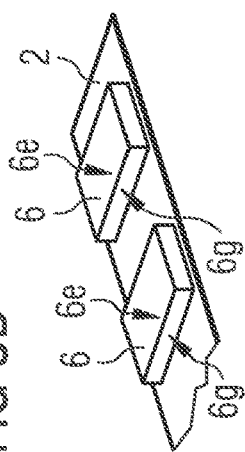

FIG. 3A shows a device 1 and a procedure according to a further exemplary embodiment. Here, the optoelectronic semiconductor chips 6 in the inlet device 2 are already provided with the appropriate orientation, for example, by a so-called pick-and-place process. The optoelectronic semiconductor chips 6 are arranged relative to the direction of transport A in such a way that surface normal of a first and second main surface 6e, 6f run transversely, in particular perpendicularly, to the direction of transport A. In addition, at least one side surface 6g is arranged in such a way that its surface normal is parallel to the direction of transport A. This may be the shorter (see FIG. 3A) or longer side of the optoelectronic semiconductor chip 6 (see FIG. 3B) of the side surface 6g, the surface normal of which is parallel to the direction of transport A.

The optoelectronic semiconductor chips 6 are conveyed along the main direction of extension A of the linear feeding device 3 to the injection device 4, where they are at least partially encapsulated by at least one cladding layer 7. The optoelectronic semiconductor chips 6 are pressed out of the outlet opening 5 in compound 8. The compound 8 can then be separated into a plurality of optoelectronic semiconductor components (see FIGS. 13 to 19) or a plurality of optoelectronic modules (see FIGS. 20 and 21) by means of a separating device 9, for example, a punching tool.

In the device 1 shown in FIG. 3A, the outlet opening 5 has a rectangular cross-section. Accordingly, the cross-section of the compound 8 is also rectangular. Furthermore, the three-dimensional shape of the compound 8 corresponds to a prism with a rectangular base.

Figure 4:
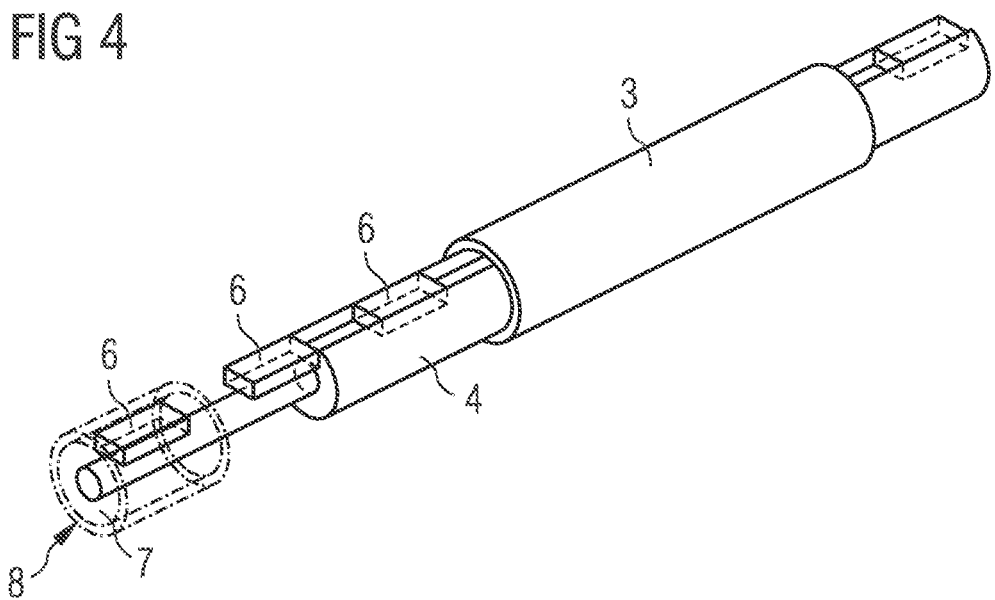
FIG. 4 shows a schematic perspective representation of a section of a device and a schematic perspective representation of a method according to a fourth exemplary embodiment.

In an injection device 4 as shown in FIG. 4, the outlet opening 5 has a circular cross-section. Accordingly, the cross-section of the compound 8 is also circular. Furthermore, the three-dimensional shape of the compound 8 corresponds to a cylinder.

Figure 5:
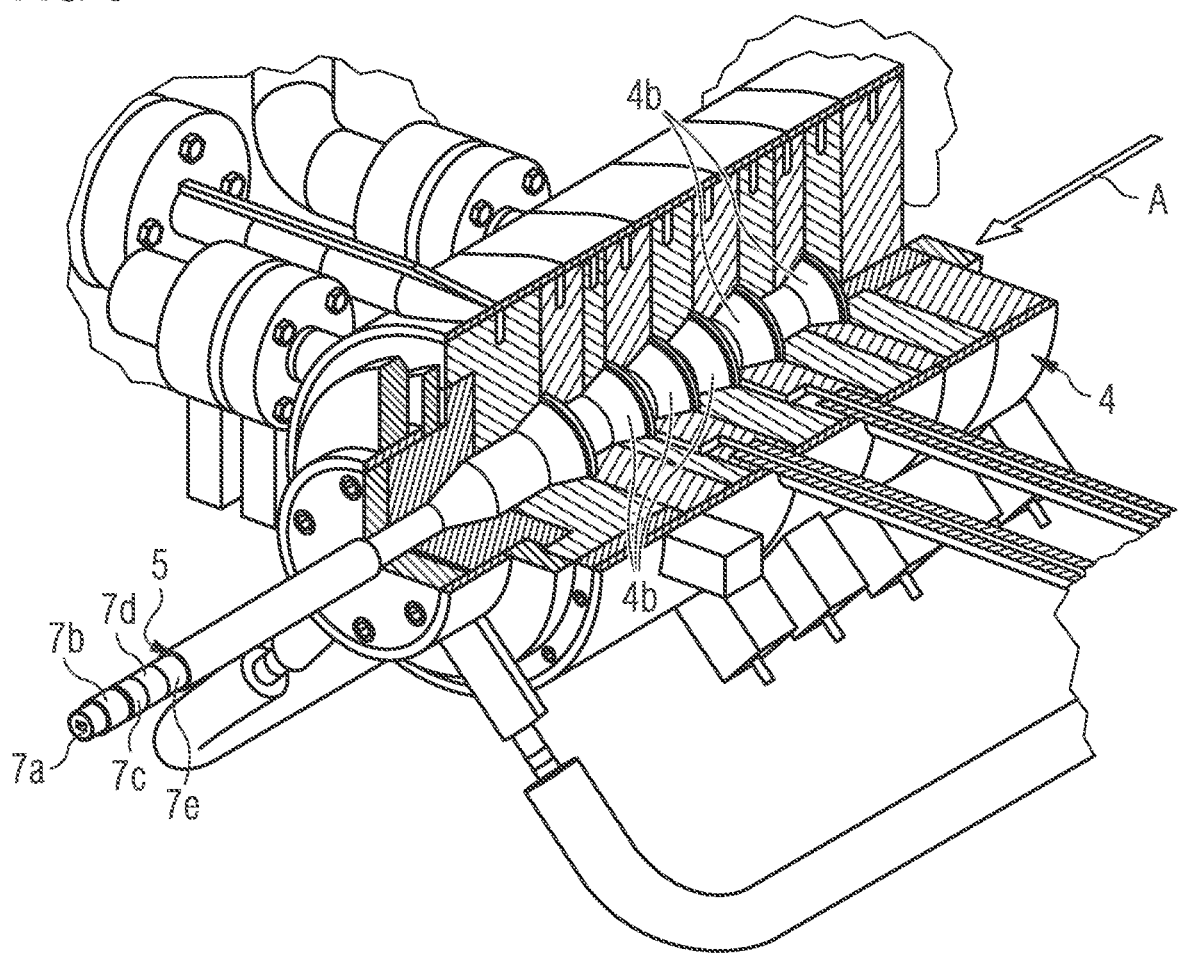
FIG. 5 shows a schematic perspective representation of an injection device according to a second exemplary embodiment.

As shown in FIG. 5, the injection device 4 may have several injection regions 4b. Different materials can be fed from the different injection regions 4b. The injection regions 4b are arranged one after the other in transport direction A, whereby different cladding layers 7a, 7b, 7c, 7d, 7e are produced by means of the injection regions 4b. The injection region 4b coming first in transport direction A forms an inner cladding layer 7a and the injection region 4b coming last in transport direction A forms an outer cladding layer 7e. In particular, the inner cladding layer 7a is enclosed by the further cladding layers 7b, 7c, 7d and 7e.

In the above described exemplary embodiments of a process, the optoelectronic semiconductor chips can be provided in the inlet device in both loose and compound form.

FIG. 6 shows an initial exemplary embodiment of an optoelectronic semiconductor chip 6 that can be encapsulated using the methods described here. The optoelectronic semiconductor chip 6 comprises a semiconductor layer sequence 6a and a substrate 6b on which the semiconductor layer sequence 6a is disposed. Furthermore, the optoelectronic semiconductor chip 6 comprises a first terminal contact 6c and a second terminal contact 6d for electrical contacting of the optoelectronic semiconductor chip 6. The terminal contacts 6c, 6d are arranged on opposite sides of the optoelectronic semiconductor chip 6, in particular on side surfaces of the semiconductor layer sequence 6a and of the substrate 6b. The optoelectronic semiconductor chip 6 has a surface composed of a first main surface 6e, a second main surface 6f opposite the first main surface 6e, and side surfaces 6g arranged transversely to the first and second main surfaces 6e, 6f. When the optoelectronic semiconductor chip 6 is encapsulated, it is arranged relative to the direction of conveyance A in particular in such a way that surface normale of the first and second main surfaces 6e, 6f run transversely, in particular perpendicularly, to the direction of conveyance A. In addition, the side surfaces 6g, on which the terminal contacts 6c, 6d are located, are preferably arranged in such a way that their surface normale run parallel to the direction of conveyance A. The encapsulation covers at least one of the surfaces 6e, 6f, 6g at least partially with a cladding layer. In particular, several surfaces 6e, 6f, 6g are completely covered by one or more cladding layers.

FIG. 7 shows a second exemplary embodiment of an optoelectronic semiconductor chip 6 that can be encapsulated using the method described here. The optoelectronic semiconductor chip 6 comprises a semiconductor layer sequence 6a and a substrate 6b on which the semiconductor layer sequence 6a is disposed. Furthermore, the optoelectronic semiconductor chip 6 comprises a first terminal contact and a second terminal contact (not shown) for electrically contacting the optoelectronic semiconductor chip 6. Both terminal contacts are arranged on a side of the semiconductor layer sequence 6a facing away from the substrate 6b. For example, the optoelectronic semiconductor chip 6 can be a sapphire chip in which the substrate 6b is made of sapphire and the semiconductor layer sequence 6a is grown on the substrate 6b. A first connection means 10a and a second connection means 10b are each arranged at the terminal contacts. The connection means 10a, 10b can, for example, be metal flags, i.e., metal strips. When the optoelectronic semiconductor chip 6 is encapsulated, it is arranged relative to the direction of conveyance A in particular in such a way that surface normale of the first and second main surfaces 6e, 6f run transversely, in particular perpendicularly, to the direction of conveyance A. Furthermore, the shorter or longer side surfaces 6g are preferably arranged in such a way that their surface normale are parallel to the direction of conveyance A. The encapsulation covers at least one of the surfaces 6e, 6f, 6g at least partially with a cladding layer. In particular, several surface 6e, 6f, 6g are completely covered by one or more layers.

Figure 8A:
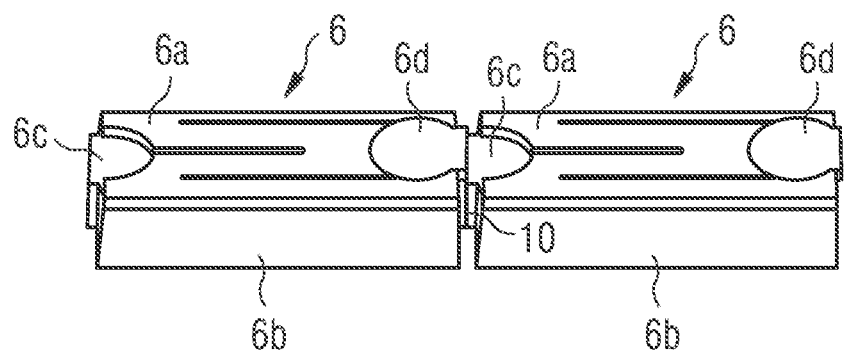
FIG. 8A shows a schematic perspective representation of a compound of optoelectronic semiconductor chips according to a first exemplary embodiment.
Figure 8B:
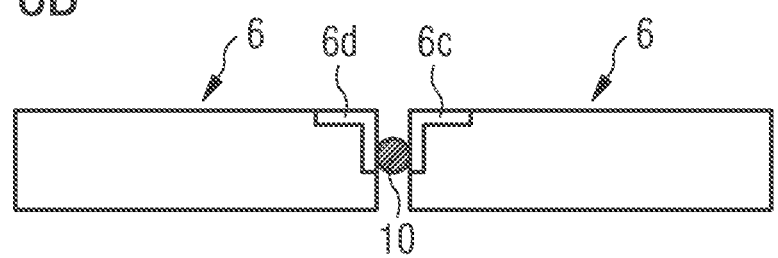
FIGS. 8B and 8C show schematic cross-sectional views of a compound comprising various connection means.
Figure 8C:
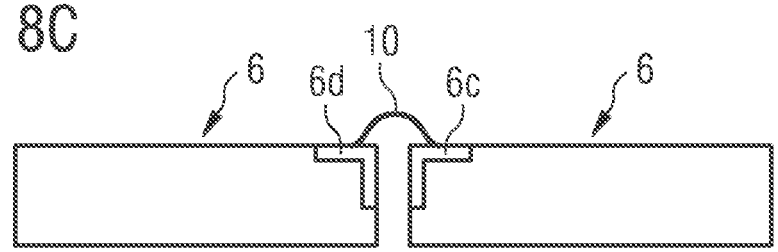

FIG. 8A shows an exemplary embodiment of a compound of optoelectronic semiconductor chips 6 formed in particular in the manner of the optoelectronic semiconductor chip 6 shown in FIG. 6. The optoelectronic semiconductor chips 6 are interconnected mechanically and/or electrically by means of a connection means 10. For example, connection means 10 may be a soldered joint in the form of a solder ball (see FIG. 8B). Alternatively, the connection means 10 can be a bond wire (see FIG. 8C). The first terminal contact 6c of one optoelectronic semiconductor chip 6 is connected to the second terminal contact 6d of the adjacent optoelectronic semiconductor chip 6 by means of the connection means 10. Preferably, the optoelectronic semiconductor chips 6 are connected in series by means of the connection means 10. The compound may have further optoelectronic semiconductor chips 6 which are connected to each other in the same way.

FIG. 9 shows another exemplary embodiment of a compound of optoelectronic semiconductor chips 6 which are formed in particular in the manner of the optoelectronic semiconductor chip 6 shown in FIG. 7. In the compound the optoelectronic semiconductor chips 6 are mechanically connected to each other at the connection means 10a, 10b. For example, the first connection means 10a of one optoelectronic semiconductor chip 6 and the second connection means 10b of the adjacent optoelectronic semiconductor chip 6 may be integrally formed in a one piece manner. Alternatively, the connection means 10a, 10b can be designed separately and connected to each other by means of a further connection means, e.g., a bonding agent. In particular, the adjacent optoelectronic semiconductor chips 6 are electrically connected by the first and second connection means 10a, 10b. The optoelectronic semiconductor chips 6 are preferably connected in series. The compound may have further optoelectronic semiconductor chips 6 which are connected to each other in the same way.

FIG. 10 shows another exemplary embodiment of a compound of optoelectronic semiconductor chips 6, where the compound in which the optoelectronic semiconductor chips 6 are arranged and formed as in FIG. 9 may also have a mount 11 on which the optoelectronic semiconductor chips 6 are arranged. For example, mount 11 can be a flexible printed circuit board. The mount 11 can be removed after the encapsulation or remain in the finished component or module.

FIG. 11 shows a compound 8 of optoelectronic semiconductor chips 6 as it exists after the encapsulation. The optoelectronic semiconductor chips 6 are interconnected by the cladding layer 7. Here, the cladding layer 7 is located in spaces between the optoelectronic semiconductor chips 6. In a module, the cladding layer 7 in the spaces serves as a connection between the optoelectronic semiconductor chips 6.

As FIG. 12 shows, this connection is severed into several optoelectronic semiconductor components 12 when the compound 8 is separated. For example, the connection means 10a, 10b can be exposed at their end areas during separation, so that the semiconductor component 12 can be electrically contacted from outside at the end regions.

Figure 13:
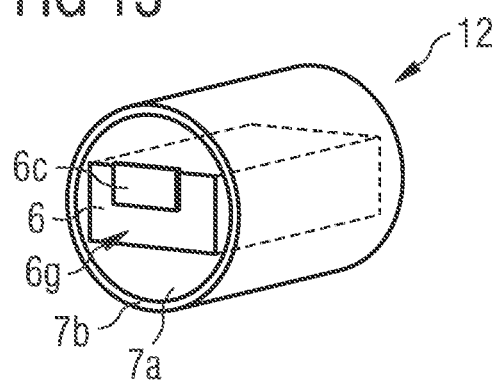
FIGS. 13 to 19 show different exemplary embodiments of optoelectronic semiconductor components in schematic perspective or cross-sectional view.

FIG. 13 shows a first exemplary embodiment of an optoelectronic semiconductor component 12. The semiconductor component 12 comprises an optoelectronic semiconductor chip 6 as shown, for example, in FIG. 6. Furthermore, the semiconductor component 12 comprises a first cladding layer 7a and a second cladding layer 7b which encapsulate the optoelectronic semiconductor chip 6 in such a way that the optoelectronic semiconductor chip 6 is mostly covered on its surface by the cladding layers 7a, 7b. In particular, with the exception of the side surfaces 6g on which the terminal contacts 6c, 6d (not shown) are located, all surfaces, in particular the first and second main surfaces and the further side surfaces of the optoelectronic semiconductor chip 6, are completely covered by the cladding layers 7a, 7b.

The first cladding layer 7a is arranged between the optoelectronic semiconductor chip 6 and the second cladding layer 7b. The first cladding layer 7a has a first refractive index and the second cladding layer 7b has a second refractive index which is different from the first refractive index. In particular, the first refractive index is greater than the second refractive index. Advantageously, it is thus possible to reduce total reflections at the transition between the optically denser (optoelectronic semiconductor chip 6) and optically thinner medium (air) and thus improve the radiation outcoupling. The cladding layers 7a, 7b thus fulfil the function of an optical element with a refractive index gradient. At the same time, the cladding layers 7a, 7b form an encapsulation of the optoelectronic semiconductor chip 6.

The optoelectronic semiconductor component 12 has a circular cross-section. Furthermore, the three-dimensional shape of the semiconductor component 12 corresponds to a cylinder. The radiation emission can take place via a lateral shell surface of the cylinder.

Figure 14:
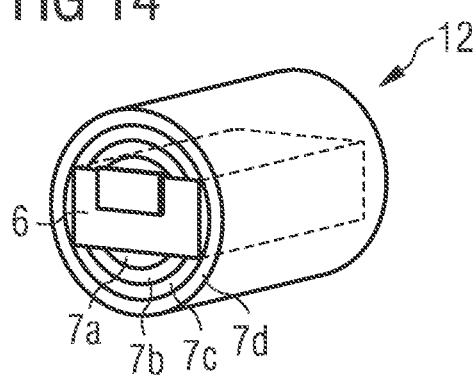

FIG. 14 shows a second exemplary embodiment of an optoelectronic semiconductor component 12, which has a larger number of cladding layers 7a, 7b, 7c, 7d, which differ from each other in their refractive index, compared to the exemplary embodiment shown in FIG. 13. The refractive index difference between two adjacent cladding layers 7a, 7b, 7c, 7d is smaller than in the first exemplary embodiment. This results in a gradual change of the refractive index from the inner cladding layer 7a to the outer cladding layer 7d.

Figure 15:
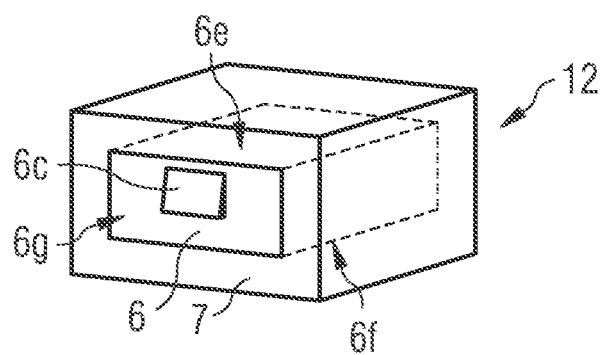

FIG. 15 shows a third exemplary embodiment of an optoelectronic semiconductor component 12. The semiconductor component 12 comprises an optoelectronic semiconductor chip 6 as shown in FIG. 6. Furthermore, the semiconductor component 12 comprises a cladding layer 7 which encapsulates the optoelectronic semiconductor chip 6 in such a way that the optoelectronic semiconductor chip 6 is mostly covered on its surface by the cladding layer 7. In particular, with the exception of the side surfaces 6g on which the terminal contacts 6c, 6d (not shown) are located, all surfaces, in particular the first and second main surfaces 6e, 6f and the further side surfaces of the optoelectronic semiconductor chip 6, are completely covered by the cladding layer 7. Furthermore, the cladding layer 7 contains one or more conversion substances. In particular, the cladding layer 7 contains a base material in which the at least one conversion material is distributed, preferably in a homogenous manner. In this exemplary embodiment, the at least one cladding layer 7 performs the function of a conversion element which is suitable for converting at least part of the radiation emitted by the optoelectronic semiconductor chip 6 into radiation of a different wavelength.

The optoelectronic semiconductor component 12 has a rectangular cross-section. Furthermore, the three-dimensional shape of the semiconductor component 12 corresponds to a prism with a rectangular base.

Figure 16:
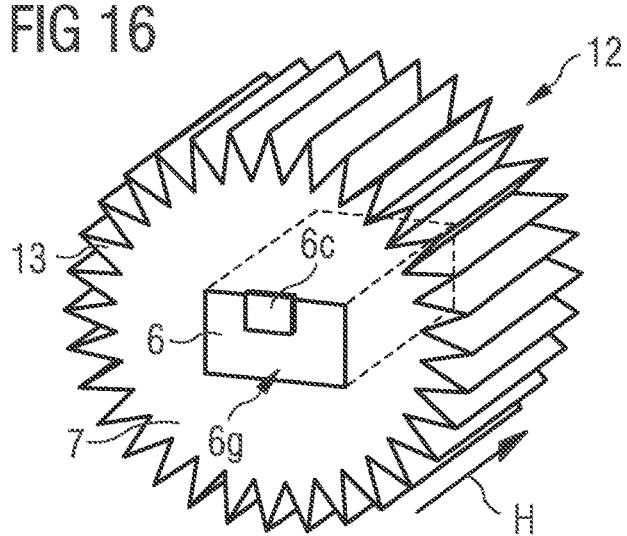

FIG. 16 shows a fourth exemplary embodiment of an optoelectronic semiconductor component 12. The semiconductor component 12 comprises an optoelectronic semiconductor chip 6 as shown in FIG. 6. Furthermore, the semiconductor device 12 comprises a cladding layer 7 which encapsulates the optoelectronic semiconductor chip 6 in such a way that the optoelectronic semiconductor chip 6 is mostly covered on its surface by the cladding layer 7. In particular, with the exception of the side surfaces 6g on which the terminal contacts 6c, 6d (not shown) are located, all surfaces, in particular the first and second main surfaces and the further side surfaces of the optoelectronic semiconductor chip 6, are completely covered by the cladding layer 7. The cladding layer 7 has prism-shaped structural elements 13 which run parallel to a main direction of extension H of the optoelectronic semiconductor chip 6. In particular, the main direction of extension H runs parallel to the surface normal of a side surface 6g at which a terminal contact is located.

The optoelectronic semiconductor component 12 has a star-shaped cross-section. The cladding layer 7 fulfils the function of an optical element in this design, which improves the radiation decoupling.

Figure 17:
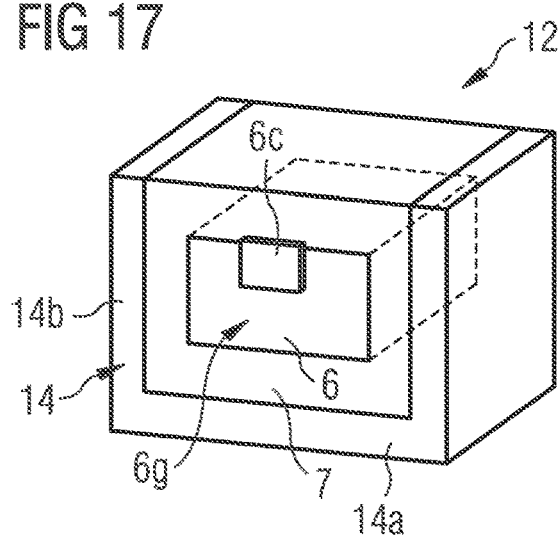

FIG. 17 shows a fifth exemplary embodiment of an optoelectronic semiconductor component 12. The semiconductor component 12 comprises an optoelectronic semiconductor chip 6 as shown in FIG. 6. Furthermore, the semiconductor component 12 comprises a cladding layer 7 which encapsulates the optoelectronic semiconductor chip 6 in such a way that the optoelectronic semiconductor chip 6 is mostly covered on its surface by the cladding layer 7. In particular, with the exception of the side surfaces 6g on which the terminal contacts 6c, 6d (not shown) are located, all surfaces, in particular the first and second main surfaces and the further side surfaces of the optoelectronic semiconductor chip 6, are completely covered by the cladding layer 7.

The semiconductor component 12 further comprises a carrier 14 having an assembly region 14a on which the optoelectronic semiconductor chip 6 is disposed and two opposing side regions 14b disposed transversely to the assembly region 14a, wherein a space between the carrier 14 and the optoelectronic semiconductor chip 6 is filled by the cladding layer 7. The optoelectronic semiconductor chip 6 is arranged at a distance from the mounting area 14a, whereby a space between the mounting area 14a and the optoelectronic semiconductor chip 6 is completely filled by the cladding layer 7. The carrier 14 has a U-shaped cross-section. For example, the carrier 14 can be designed as a reflector. Preferably the carrier 14 contains or consists of a metal.

Figure 18:
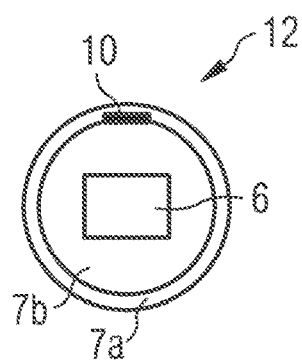

FIG. 18 shows a sixth exemplary embodiment of an optoelectronic semiconductor component 12. The semiconductor component 12 comprises an optoelectronic optoelectronic semiconductor chip 6 as shown in FIG. 6. Furthermore, the semiconductor component 12 comprises a first cladding layer 7a and a second cladding layer 7b which encapsulate the optoelectronic semiconductor chip 6 in such a way that the optoelectronic semiconductor chip 6 is mostly covered on its surface by the cladding layers 7a, 7b. In addition, the semiconductor component 12 includes a connection means 10, which can be a wire, for example. The connection means 10 is arranged between the cladding layers 7a, 7b. For example, the connection means 10 can be used to electrically connect two semiconductor chips. During production, the connection means 10 can also be inserted into the feeding device and processed during the encapsulation of the optoelectronic semiconductor chips.

Figure 19:
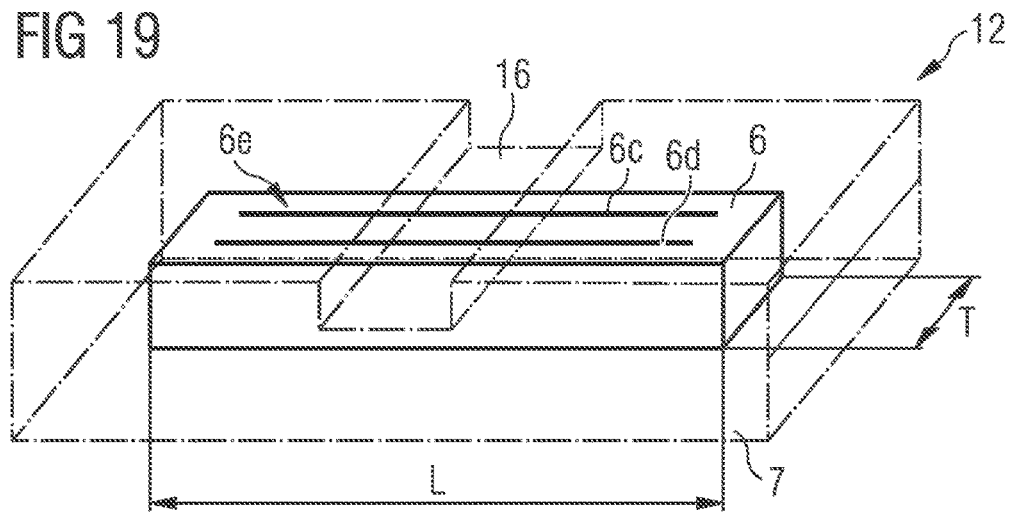

FIG. 19 shows a seventh exemplary embodiment of an optoelectronic semiconductor component 12. The semiconductor component 12 comprises an optoelectronic semiconductor chip 6 and terminal contacts 6c, 6d arranged on the first main surface 6e of the optoelectronic semiconductor chip 6. Furthermore, the semiconductor component 12 comprises a cladding layer 7, which almost completely encapsulates the optoelectronic semiconductor chip 6. Only in a central area of the optoelectronic semiconductor chip 6 does the semiconductor component 12 have a recess 16 in the cladding layer 7, in which the optoelectronic semiconductor chip 6 or the terminal contacts 6c, 6d are exposed. The recess 16 in the cladding layer 7 enables electrical contacting of the semiconductor component 12.

In the seventh exemplary embodiment, the optoelectronic semiconductor chip 6 is comparatively long. The optoelectronic semiconductor chip has a smaller second side length T and a larger first side length L, whereby the larger first side length L in particular is at least 10 times larger than the smaller second side length T.

Figure 20:
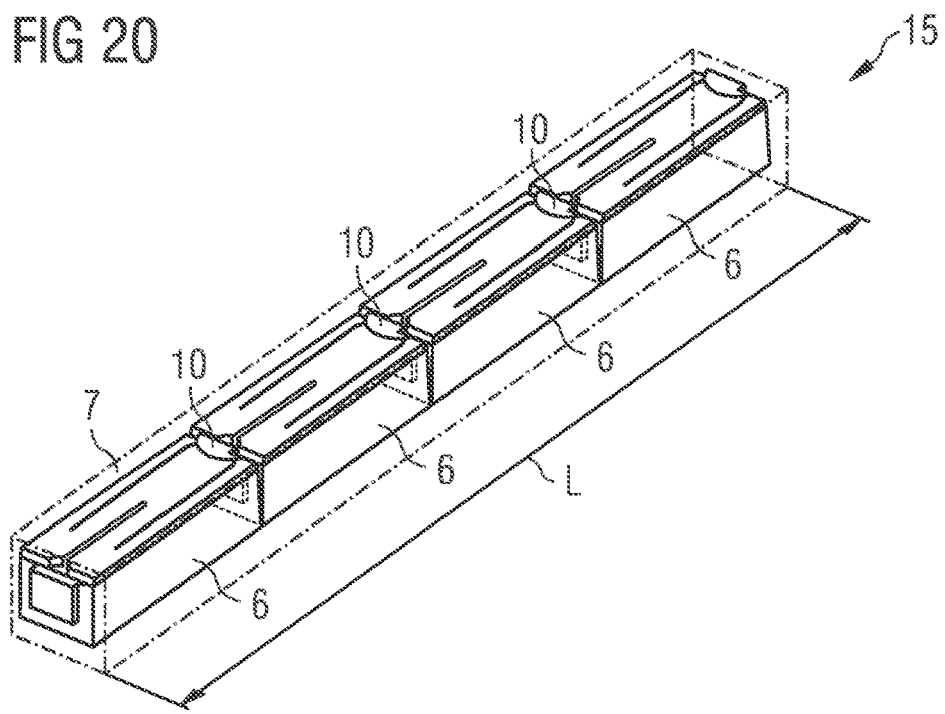
FIG. 20 shows a schematic perspective representation of an optoelectronic module according to a first exemplary embodiment.

FIG. 20 shows a first exemplary embodiment of an optoelectronic module 15 comprising a plurality of optoelectronic semiconductor chips 6 and a cladding layer 7 encapsulating the optoelectronic semiconductor chips 6 such that the surface of the optoelectronic semiconductor chips 6 is mostly covered by the cladding layer 7, wherein the optoelectronic semiconductor chips 6 are interconnected by the cladding layer 7. In particular, the cladding layer 7 contains a material that is transparent to the radiation generated by the optoelectronic semiconductor chips 6. The individual optoelectronic semiconductor chips 6 can be designed in the same way as the optoelectronic semiconductor chip 6 shown in FIG. 6 and can only be connected to each other by the cladding layer 7. Alternatively, the optoelectronic semiconductor chips 6 can also be connected to each other with a connection means 10. For example, optoelectronic semiconductor chips 6 form a series circuit. Module 15 has a linear, strand-like shape. Module 15 can have a first side length L of up to several meters.

Figure 21:
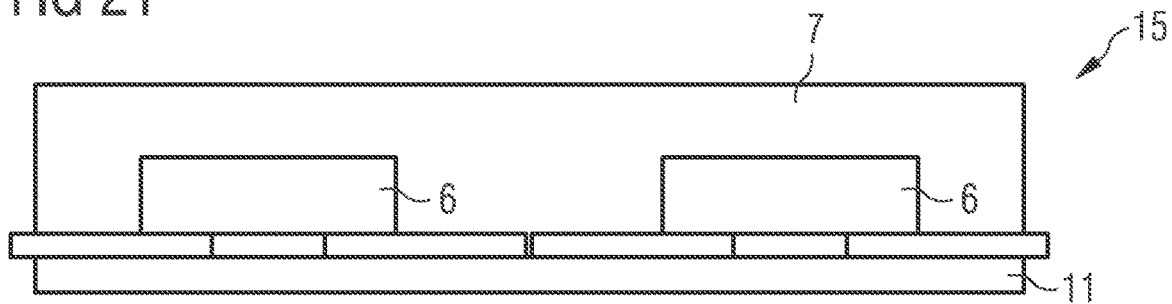
FIG. 21 shows a schematic cross-sectional view of an optoelectronic module according to a second exemplary embodiment.

FIG. 21 shows a second exemplary embodiment of an optoelectronic module 15 comprising a plurality of optoelectronic semiconductor chips 6 and a cladding layer 7 encasing the optoelectronic semiconductor chips 6 such that the surface of the optoelectronic semiconductor chips 6 is mostly covered by the cladding layer 7, the optoelectronic semiconductor chips 6 being interconnected by the cladding layer 7. In particular, the cladding layer 7 contains a material that is transparent to the radiation generated by the optoelectronic semiconductor chips 6. The individual optoelectronic semiconductor chips 6 can be designed in the same way as the optoelectronic semiconductor chip 6 shown in FIG. 7. The optoelectronic semiconductor chips 6 can only be connected to each other by the cladding layer 7 (see FIG. 11) or, as in this exemplary embodiment, by a mount 11.

The invention is not limited by the description of the exemplary embodiments. Rather, the invention includes any new feature and any combination of features, which in particular includes any combination of features in the patent claims, even if that feature or combination itself is not explicitly mentioned in the patent claims or exemplary embodiments.

The invention claimed is:

1. A method for producing a plurality of optoelectronic semiconductor components and/or at least one optoelectronic module, the method comprising:
   inserting a plurality of optoelectronic semiconductor chips with a suitable orientation into a linear feeding device;
   conveying the optoelectronic semiconductor chips to an injection device having an outlet opening;
   encapsulating the optoelectronic semiconductor chips with at least one cladding layer in the injection device and pressing the encapsulated optoelectronic semiconductor chips out of the outlet opening, wherein a compound of optoelectronic semiconductor chips is formed in which the optoelectronic semiconductor chips are connected to one another by the at least one cladding layer; and
   separating the compound into a plurality of optoelectronic semiconductor components each component having an optoelectronic semiconductor chip which is at least partially encapsulated by the at least one cladding layer, and/or separating the compound into at least one optoelectronic module comprising a plurality of optoelectronic semiconductor chips which are at least partially encapsulated and connected to one another by the at least one cladding layer.

2. The method according to claim 1, wherein a shape of the outlet opening determines the shape of the optoelectronic semiconductor components or the optoelectronic module such that a cross-section of the outlet opening corresponds to a cross-section of the optoelectronic semiconductor components or the optoelectronic module.

3. The method according to claim 1, wherein the outlet opening has a polygonal cross-section, and wherein a prismatic bond is formed when pressed out.

4. The method according to claim 1, wherein the outlet opening has an oval cross-section, and wherein a cylindrical compound is produced when pressed out.

5. The method according to claim 1, wherein the optoelectronic semiconductor chips are introduced one after the other into the feeding device.

6. The method according to claim 1, wherein a material used for the cladding layer is supplied transversely to a conveying direction of the optoelectronic semiconductor chips.

7. The method according to claim 1, wherein the injection device has a plurality of injection regions from which different materials are supplied.

8. The method according to claim 7, wherein different cladding layers are produced from the different materials.

9. The method according to claim 7, wherein the injection regions are arranged one after the other in a conveying direction of the optoelectronic semiconductor chips and various cladding layers are produced by the injection regions, wherein the cladding layers are arranged one after the other in a direction running transversely to the conveying direction starting from the optoelectronic semiconductor chips.

10. The method according to claim 1, wherein at least one of the following materials is used for the at least one cladding layer: a thermoplastic resin or an epoxy resin or silicone.

11. The method according to claim 1, wherein the optoelectronic semiconductor chips are introduced into the feeding device in a compound manner, the optoelectronic semiconductor chips being connected to one another by a mount and/or a connection means.

* * * * *